US 7,681,306 B2

(12) United States Patent
Heschel et al.

(10) Patent No.: US 7,681,306 B2
(45) Date of Patent: Mar. 23, 2010

(54) METHOD OF FORMING AN ASSEMBLY TO HOUSE ONE OR MORE MICRO COMPONENTS (75) Inventors: Matthias Heschel, Rodovre (DK); Arnd Kilian, Berlin (DE)

(73) Assignee: Hymite A/S, Alleroed (DK)

( * ) Notice: Subject to any disclaimer, the term of this patent is extended or adjusted under 35 U.S.C. 154(b) by 1429 days.

(21) Appl. No.: 10/833,428

(22) Filed: Apr. 28, 2004

(65) Prior Publication Data
US 2005/0241135 A1 Nov. 3, 2005

(51) Int. Cl.
H05K 3/20 (2006.01)

(52) U.S. Cl. ............... 29/831; 29/602.1; 29/841; 29/852; 29/854; 73/159; 73/204.17; 438/119; 438/455; 438/458; 438/459; 451/5; 451/41

(58) Field of Classification Search ............... 29/592.1, 29/602.1, 831, 841, 852, 854; 73/159, 204.1, 73/204.17, 206.26; 438/119, 455, 458, 459; 451/5, 41
See application file for complete search history.

(56) References Cited

U.S. PATENT DOCUMENTS

| 4,897,711 A | 1/1990 | Blonder et al. |
| 4,903,120 A | 2/1990 | Beene et al. |
| 4,904,036 A | 2/1990 | Blonder |
| 5,023,881 A | 6/1991 | Ackerman et al. |
| 5,068,203 A | 11/1991 | Logsdon et al. |
| 5,308,442 A | 5/1994 | Taub et al. |
| 5,608,436 A | 3/1997 | Baughman et al. |
| 5,656,507 A | 8/1997 | Welbourn et al. |
| 5,703,394 A | 12/1997 | Wei et al. |
| 5,891,354 A | 4/1999 | Lee et al. |
| 5,898,806 A | 4/1999 | Nishimoto |
| 5,907,650 A * | 5/1999 | Sherman et al. ............... 385/80 |
| 6,004,865 A * | 12/1999 | Horiuchi et al. ............ 438/459 |
| 6,028,001 A | 2/2000 | Shin |
| 6,036,872 A | 3/2000 | Wood et al. |
| 6,072,815 A | 6/2000 | Peterson |
| 6,074,567 A | 6/2000 | Kuraishi et al. |

(Continued)

FOREIGN PATENT DOCUMENTS

EP 0 430 593 A2 6/1991

(Continued)

OTHER PUBLICATIONS

Linder et al., "Fabrication Technology for Wafer Through-Hole interconnections and three-Dimensional Stacks of Chips and Wafers," Micro Electro Mechanical Systems, 1994, MEMS '94, Proceedings, IEEE Workshop On Oiso, Japan Jan. 25-28, 1994, New York, NY, USA, IEEE, pp. 349-354.

(Continued)

Primary Examiner—Paul D Kim
(74) Attorney, Agent, or Firm—Fish & Richardson P.C.

(57) ABSTRACT

Formation of a structure with through-holes includes attaching two sub-structures to one another. The resulting structure may be used in a sub-assembly for various types of micro components and may serve as a lid or base of a housing that encapsulates one or more micro components. The techniques may provide greater flexibility in the shape of the through-holes and may reduce costs compared with other known techniques.

29 Claims, 9 Drawing Sheets

U.S. PATENT DOCUMENTS

| | | | |
|---|---|---|---|
| 6,117,794 | A | 9/2000 | Dormer et al. |
| 6,139,761 | A | 10/2000 | Ohkuma |
| 6,221,769 | B1 | 4/2001 | Dhong et al. |
| 6,577,427 | B1 | 6/2003 | Gee et al. |
| 6,660,564 | B2 | 12/2003 | Brady |
| 2003/0071283 | A1 | 4/2003 | Heschel |

FOREIGN PATENT DOCUMENTS

| | | |
|---|---|---|
| EP | 0 795 766 A1 | 9/1997 |
| EP | 0 884 782 A1 | 12/1998 |
| EP | 1 061 578 A1 | 12/2000 |
| WO | WO 00/07225 | 2/2000 |
| WO | WO 00/41281 | 7/2000 |
| WO | WO 01/24228 A2 | 4/2001 |
| WO | WO 03/034490 | 4/2003 |

OTHER PUBLICATIONS

Mita Y. et al., "Embedded-Mask-Methods for mm-scale multi-layer vertical/slanted Si structures," Proceedings IEEE thirteenth Annual International Conference on Micro electro Mechanical Systems, Jan. 23-27, 2000, pp. 300-305.

* cited by examiner

Carrier structure

Thinning

METHOD OF FORMING AN ASSEMBLY TO HOUSE ONE OR MORE MICRO COMPONENTS

BACKGROUND

This disclosure relates to techniques for providing a structure with through-holes that may be used, for example, in a sub-assembly for micro components.

Sub-assemblies for micro components such as optoelectronic devices or optoelectronic hybrid integrated circuits may include a semiconductor structure formed as a lid, which may be sealed to a base. One or more active and passive micro components may be encapsulated within the sub-assembly. Typically, electrical or optical connections may need to be provided to the components mounted within the assembly.

The assignee of the present application previously has disclosed, in U.S. Published application Ser. No. 2003/0071283, a double-sided etching technique for providing a semiconductor structure with one or more through-holes, which may be sealed hermetically, for example, by a feed-through metallization process. The structure in which the through-holes are formed may include a silicon-on-insulator (SOI) structure. Electrical contacts to an optoelectronic or other component housed within the assembly may be provided via the feed-through metallization.

The present invention discloses alternative techniques for providing similar structures.

SUMMARY

The present disclosure relates to the formation of a structure with through-holes. The structure may be used, for example, in a sub-assembly for various types of micro components and may serve as a lid or base of a housing that encapsulates one or more micro components. As used in this disclosure, the phrase "micro components" means electronic devices, optical devices, electromagnetic devices, chemical devices, micro-mechanical devices, optoelectronic devices, micro-electromechanical system (MEMS) devices, micro-optoelectromechanical system (MOEMS) devices and other such devices that contain tiny, micron and sub-micron-sized elements.

According to one aspect, a method of forming an assembly to house one or more micro components includes providing a first sub-structure having a first through-hole; and attaching the first sub-structure to a second sub-structure having a group of one or more through-holes each of which is smaller than the first through-hole in the first sub-structure. The group of smaller through-holes in the second sub-structure is positioned opposite the through-hole in the first sub-structure.

In another aspect, a method of forming an assembly to house one or more micro components includes providing a first substantially planar sub-structure having a first through-hole and attaching the first sub-structure to a second substantially planar sub-structure. Subsequently a group of one or more through-holes is formed in the second sub-structure. Each through-hole in the second sub-structure is smaller than the first through-hole in the first sub-structure, and the group of smaller through-holes in the second sub-structure is positioned opposite the through-hole in the first sub-structure.

In various implementations, one or more of the following features may be present. For example, the structure comprising the first and second sub-structures may be used as a lid of a housing that encapsulates the one or more micro components. Alternatively, the structure comprising the first and second sub-structures may be used as a base of a housing that encapsulates the one or more micro components.

The method may include providing feed-through metallization in at least one of the through-holes in the second sub-structure. The second sub-structure may be at least several times thinner than the first sub-structure.

The first sub-structure may be etched or molded to form the first through-hole therein. Various etching processes, including dry etching, isotropic wet etching, or anisotropic wet etching may be used. Depending on the technique used to form the through-holes, they may have various shapes including, for example, concave sidewalls or slanted sidewalls.

Forming the through-holes in the second sub-structure may include partially etching the second sub-structure to form grooves in a surface on a first side of the second sub-structure and thinning the second sub-structure from a side opposite from the first side. The thinning process may include, for example, a chemical-mechanical polishing process. To facilitate the thinning process, the second sub-structure may be attached to a carrier substrate before performing the thinning of the second sub-structure. After the first sub-structure is attached to the second sub-structure, the carrier substrate from the second sub-structure may be removed. The first sub-structure may be attached to the second sub-structure after partially etching the second sub-structure to form the grooves, but before performing the thinning.

Various implementations may include one or more of the following advantages. The sub-structures may be formed, for example, of silicon or glass, which may be less costly than using a SOI structure as disclosed in the published application identified above. Furthermore, the techniques described in the present application may provide greater flexibility in the shape of the through-holes.

Other features and advantages may be apparent from the following detailed description, the accompanying drawings and the claims.

DETAILED DESCRIPTION

Figure 1:
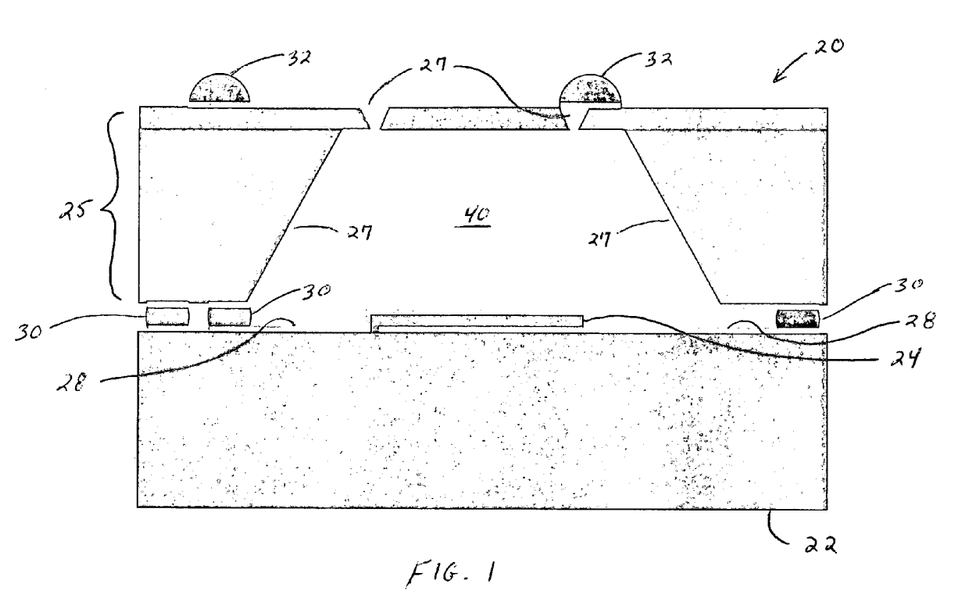
FIG. 1. is a cross-section of an example of an assembly that houses a MEMS device according to the invention.

As shown in FIG. 1, an assembly 20 for a MEMS component 24 includes two structures 22, 25 that are soldered together to provide a hermetically sealed package that encapsulates the MEMS device. The bottom structure 22 includes a semiconductor or other substrate that serves as a base on which the MEMS device 24 is mounted or in which the MEMS device is formed. Metal leads 28 may be provided on the surface of the base and are electrically connected to the MEMS device 24. The upper structure 25 serves as a lid and includes feed-through metallization 27 to permit electrical connections from the exterior of the package to the MEMS device inside the package. A recessed cavity 40 is provided in the lower section of the lid 25 to allow room for the MEMS device.

The feed-through metallization 27 extends through one or more micro-vias (i.e., through-holes) in the upper section of the lid 25. The feed-through metallization 27 extends along the outer surface of the lid 25 and is electrically connected to solder bumps 32 for printed board assembly. The feed-through metallization 27 also extends outside the recessed cavity 40 along the cavity-side surface of the lid structure 25. Solder 30 is deposited onto the feed-through metallization outside the recessed cavity 40 to provide solder bumps for electrical connection to the metal leads 28. Additional solder 30 is deposited on the cavity-side of the lid structure 25 to provide a solder seal ring.

Other active and passive micro components may be mounted to the base 22 and encapsulated within the package. Although in FIG. 1 the feed-through metallization 27 is shown extending through only two through-holes in the upper section of the lid 25, feed-through metallization may be provided through additional through-holes for electrical contact to the same or other micro components in the package.

Figure 2:
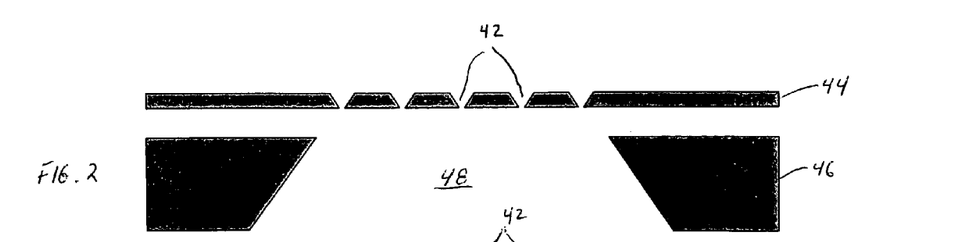
FIGS. 2 and 3 illustrate formation of a lid for the assembly using pre-processed sub-structures.
Figure 3:
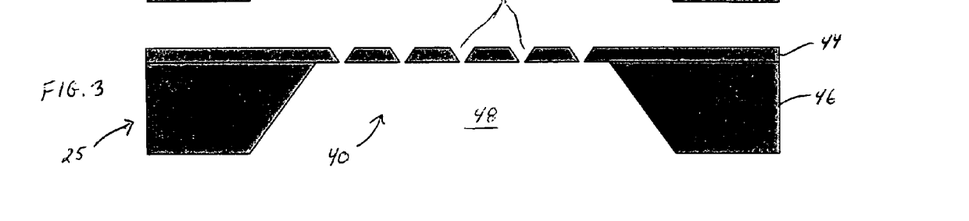

FIGS. 2 and 3 illustrate formation of the lid 25 using two pre-processed substantially planar sub-structures 44, 46. The first, lower sub-structure 46, which may comprise, for example, silicon or glass, includes a relatively large through-hole 48 that serves as the recessed cavity 40 when the two sub-structures are attached together. The second, upper sub-structure 44, which also may comprise, for example, silicon or glass, includes one or more through-holes 42. The through-holes 42 in the upper sub-structure 44 may be many times smaller than the through-hole 48 in the lower sub-structure 46. For example, in many applications, the through-holes 42 may have diameters less than ten microns, and for some applications, diameters on the order of several microns (e.g., 3-5 μm) may be preferred. The upper sub-structure 44 may be many times thinner than the second, lower sub-structure 46.

The lid 25 may be formed by attaching the two pre-processed sub-structures 44, 46 so that the smaller through-holes 42 in the second sub-structure are located opposite the larger through-hole 48 in the first sub-structure as shown in FIG. 3. The particular technique used to attach the sub-structures to another may vary depending on the materials involved. Examples of such techniques include silicon-direct-bonding, anodic bonding, glass frit bonding, glass soldering and reflow (eutectic) soldering. In some implementations, some of the through-holes 42, 48 may be formed (or completed) after the two sub-structures 44, 46 are attached to one another.

The lower sub-structure 46 may include multiple large through-holes, each of which is similar to the through-hole 48. Similarly, the upper sub-structure 44 may include multiple groups of smaller through-holes 42, with each group of smaller through-holes located opposite a respective one of the larger through-holes in the lower sub-structure.

Figure 4:
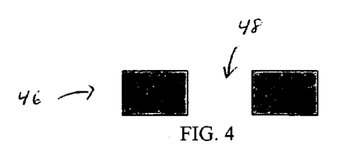
FIGS. 4 through 7 illustrate various shapes of through-holes in the lower sub-structure for the lid.
Figure 5:
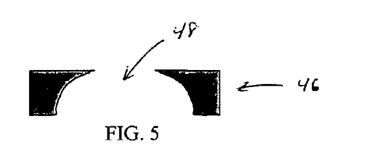
Figure 6:
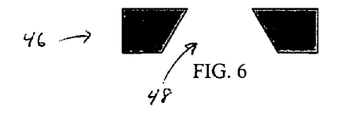
Figure 7:
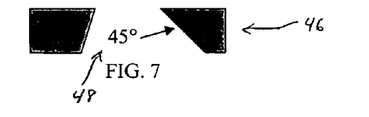

Formation of the through-hole(s) 48 in the lower sub-structure 46 may be achieved, for example, by etching a plain silicon or other semiconductor wafer. Known photolithographic or other techniques may be used to define the areas of the wafer in which the through-holes are to be opened. The through-holes 48 may have various shapes depending on the particular etch process used. For example, a dry etching or laser drilling technique may result in through-holes with steep sidewalls (FIG. 4), whereas an isotropic wet etching technique may result in through-holes with concave sidewalls (FIG. 5). An anisotropic wet etching technique may result in slanted sidewalls (FIG. 6). For normal cut silicon wafers with (100) surface crystal orientation, the angle between the sidewall and the wafer surface is about 54.74°. The angle can be tuned by cutting the wafers off-angle from the ingot. For some applications, an angle of about 45° is preferred (FIG. 7).

In some implementations, the sub-structure 46 may be formed from etched or molded glass.

Figure 8A:
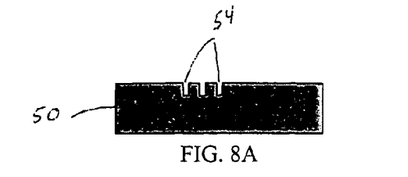
FIGS. 8A and 8B illustrate formation of the upper sub-structure for the lid according to one implementation.
Figure 9A:
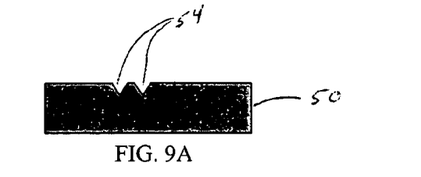
FIGS. 9A and 9B illustrate formation of the upper sub-structure for the lid according to another implementation.
Figure 16A:
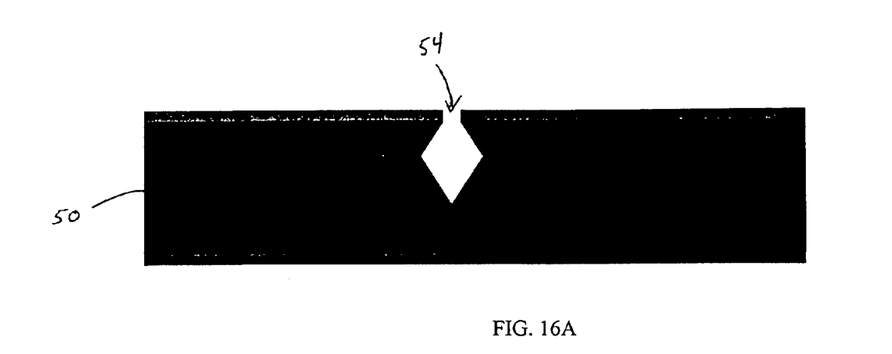
FIGS. 16A and 16B illustrate another example of a lid structure using rhomboid-shaped holes.

Formation of the through-holes 42 in the upper sub-structure 44 may include, for example, partially etching a plain silicon or other semiconductor wafer 50 as shown in FIGS. 8A and 9A. The etch depth should exceed the thickness of the final upper sub-structure. Known photolithographic or other techniques may be used to define the areas of the wafer in which the holes are to be opened. An oxide or other layer may be used as a mask. The shape of the etched holes 54 may vary depending on the type of etch employed. Dry etching or laser drilling may result in holes with steep sidewalls (FIG. 8A) whereas anisotropic wet etching may result in etched grooves with slanted sidewalls (FIG. 9A). If a plain silicon wafer with a (100) surface crystal orientation is used, the angle between the sidewalls and the wafer surface is about 54.74°. A combination of dry etching followed by anisotropic wet etching (e.g., KOH etching) may be used to provide rhomboid-shaped holes 54 (FIG. 16A).

Figure 8B:
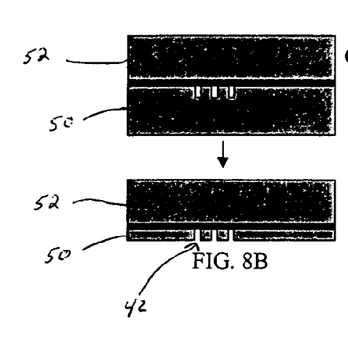
Figure 9B:
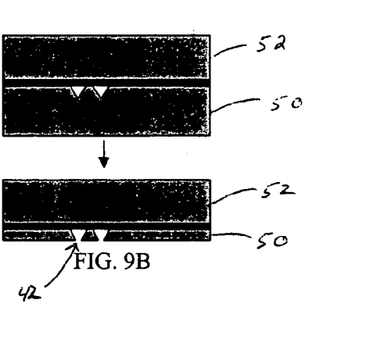
Figure 10A:
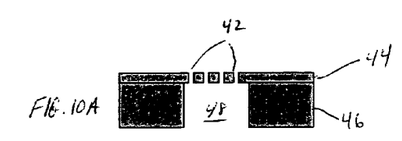
FIGS. 10A through 10H illustrate examples of lid structures with various combinations of through-hole shapes according to the invention.
Figure 10B:
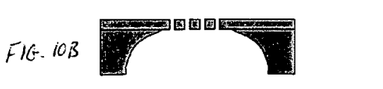
Figure 10C:
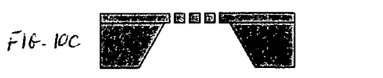
Figure 10D:
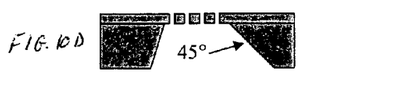
Figure 10E:
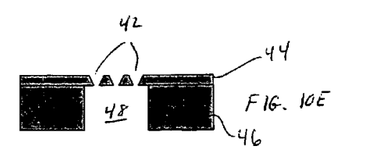
Figure 10F:
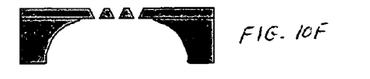
Figure 10G:
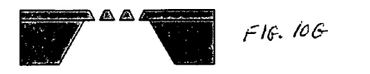
Figure 10H:
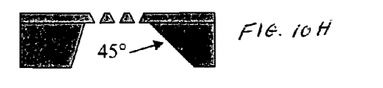
Figure 11A:
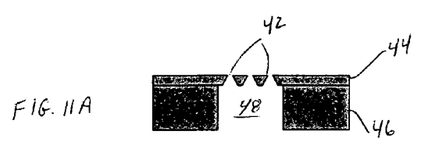
FIGS. 11A through 11D illustrate additional examples of lid structures with various combinations of through-hole shapes according to the invention.
Figure 11B:
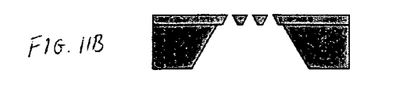
Figure 11C:
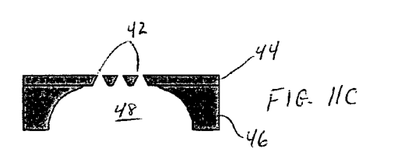
Figure 11D:
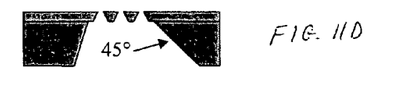

To complete formation of the through-holes in the upper sub-structure 44, the wafer 50 can be thinned, for example, by chemical-mechanical polishing (CMP). To ensure proper handling of the wafer 50 for the thin upper sub-structure 44, it may temporally be attached to a carrier structure 52 as in FIGS. 8B or 9B. The carrier structure 52 may include another wafer or some other substrate. The wafer 50 is thinned until enough material has been removed from the side of the wafer opposite the holes 54 to result in through-holes extending through the wafer.

The upper and lower sub-structures 44, 46 may be attached to one another as discussed above, and the carrier structure 52 then may be removed from the upper sub-structure. Various lid structures are shown in FIGS. 10A through 10H. As can be seen from the examples, a wide range of combination of shapes for the through-holes 42 and 48 is possible.

In some implementations, use of the separate wafer 52 as the carrier structure during the CMP thinning process may be avoided. For example, after formation of the partially etched holes 54 in the wafer 50 (see, e.g., FIGS. 8A, 9A and 16A), and prior to the thinning process, the wafer 50 for the upper sub-structure may be attached to the pre-processed wafer for the lower sub-structure 46. In that case, the side of the wafer 50 in which the holes 54 were etched is placed face down against the wafer for the lower sub-structure 46. The CMP process then may be performed to thin the wafer 50, with the lower sub-structure 46 supporting the wafer 50 as it is thinned to complete the through-holes 42 in the upper sub-structure 44. Examples of lid structures that result when anisotropic wet etching is used to form the holes 54 (FIGS. 8A and 9A) are shown in FIGS. 11A through 11D. An example of a lid structure that results from a rhomboid-shaped hole (FIG.

Figure 16B:
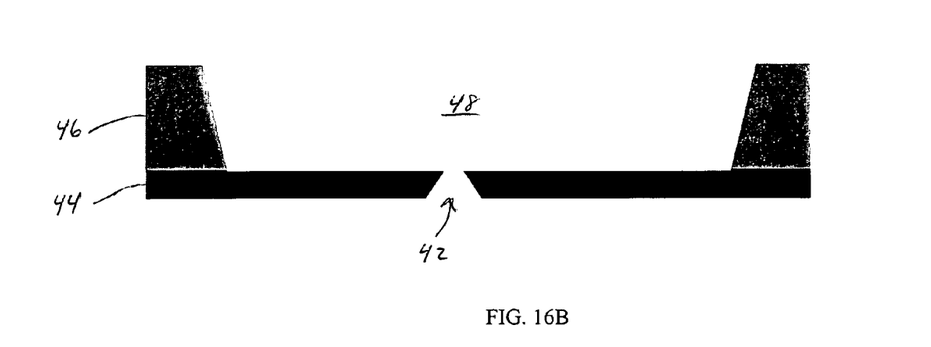

16A) is shown in FIG. 16B. Rhomboid-shaped holes may be advantageous in situations where the through-hole is completed after bonding the sub-structures 44, 46. Such techniques can allow the final size of the opening for the through-hole to be controlled more accurately.

In yet other implementations, the pre-processed lower sub-structure 46 (e.g., FIGS. 4, 5, 6 or 7) may be attached to a plain wafer that is to serve as the upper sub-structure. The wafer for the upper sub-structure then may be thinned, for example, by a CMP process. Following the thinning process, the through-holes 42 may be etched into the wafer for the upper sub-structure.

Figure 12:
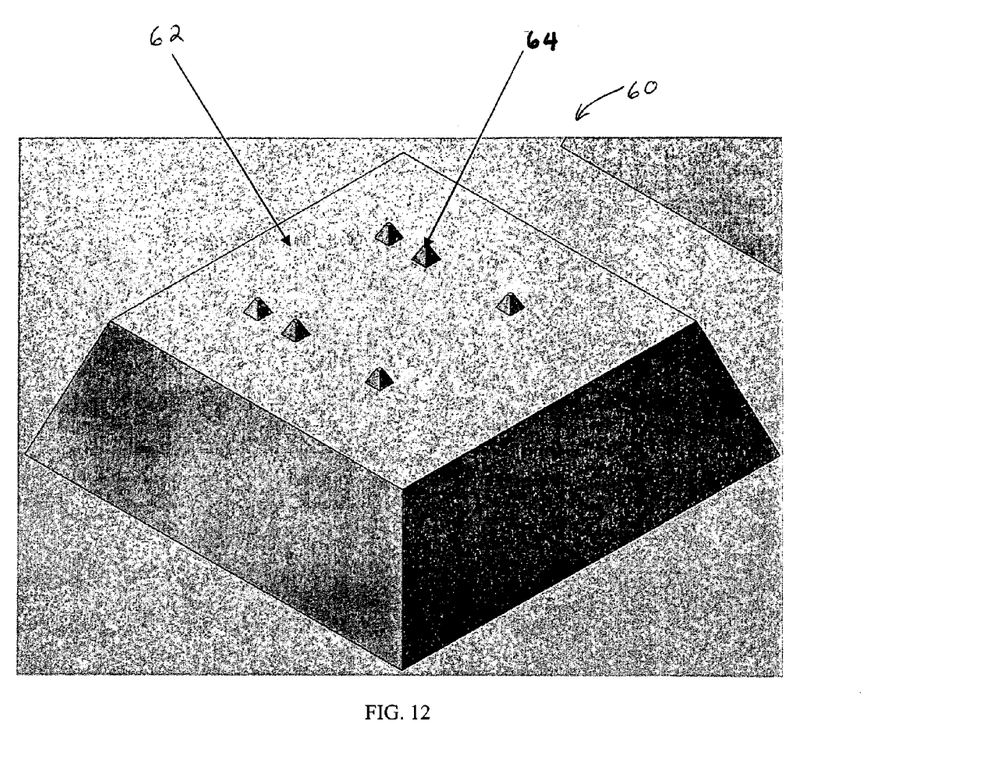
FIG. 12 illustrates part of a molding tool that may be used to form the lid.

In an alternative implementation, the lid structure 25 may be formed from a single piece of molded glass. As illustrated in FIG. 12, a molding tool 60 may include a large island 62 for formation of the large recessed cavity 48 and smaller protrusions 64 corresponding to the through-holes 42. The molded glass may be polished from the side opposite the molded surface until the indentations formed by the smaller protrusions 64 become through-holes.

After formation of the lid structure 25, hermetically sealed feed-through connections 27 may be provided for electrical contacts from the exterior of the lid to its underside. The through-holes 42 may be hermetically sealed, for example, using an electro-plated feed-through metallization process as the base for the through-hole connections. The feed-through metallization also may include a diffusion barrier, and the sealing material may include, for example, a non-noble metal. Further details of a feed-through metallization process that may be used are disclosed in applicant's published U.S. application identified above.

Figure 13A:
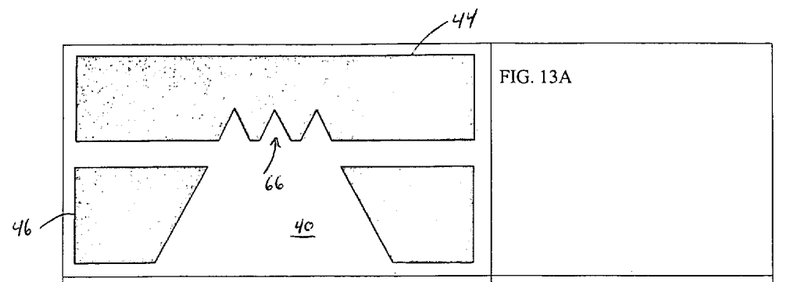
FIGS. 13A through 13D illustrate an alternative technique for formation of the lid with feed-through metallization.
Figure 13B:
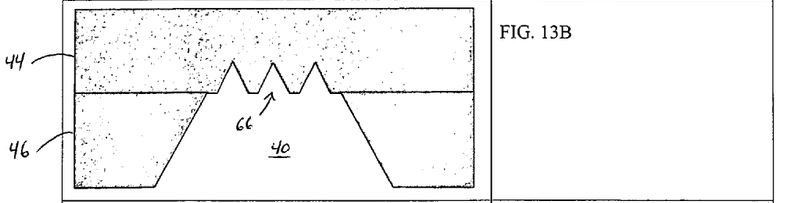
Figure 13C:
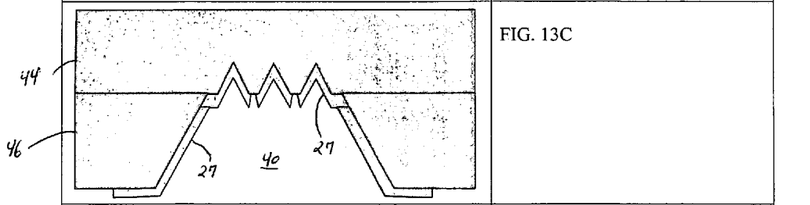
Figure 13D:
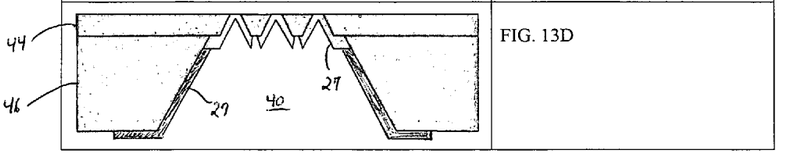

In the foregoing examples, it was assumed that the feed-through metallization is provided after completion of the through-holes 42 (i.e., after the CMP thinning process). However, in other implementations, the feed-through metallization may be provided before the CMP thinning process. As shown for example, in FIGS. 13A and 13B, the wafer for the upper sub-structure 44, with partially etched vias 66 for the through-holes 42, may be attached to the pre-processed wafer for the lower sub-structure 46. Feed-through metallization 27 then may be provided in the cavity 40 and in the vias 66 (see FIG. 13C). After formation of the feed-through metallization, the upper sub-structure 44 may be thinned, for example, by a CMP process to expose the feed-through metallization (see FIG. 13D).

Once the lid structure 25 is completed, it may be attached to the base 22 on which the MEMS device 24 is mounted to form a hermetically sealed assembly.

The foregoing techniques for forming a structure with through-holes also may be used in connection with assemblies for optoelectronic or other devices. Furthermore, instead of a lid, the structure with the through-holes may serve as the base on (or in) which the micro components are mounted.

Figure 14:
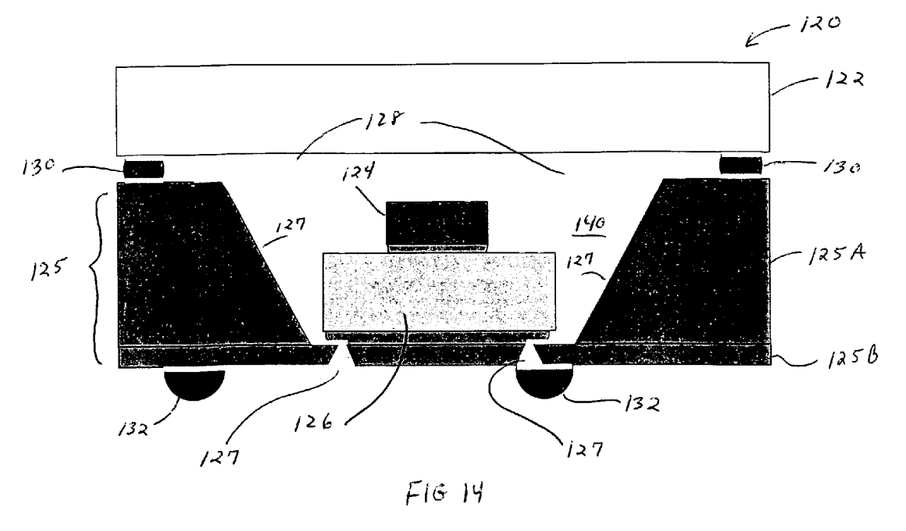
FIG. 14 is a cross-section of an example of an assembly that houses an optoelectronic device according to the invention.

As shown, for example, in FIG. 14, the assembly 120 includes two structures 122, 125 that are soldered together to provide a hermetically sealed package that encapsulates an optoelectronic device 124, which may be, for example, a photodiode. The upper structure 122 serves as a lid and should be transparent to the wavelength(s) that are to be sensed or emitted by the optoelectronic device 124.

In the illustrated example, the optoelectronic device 124 is mounted on a integrated circuit chip 126, which, in turn, is mounted on the lower structure 125 which serves as a base. If the optoelectronic device 124 is a photodiode, the integrated circuit chip 126 could be, for example, a trans-impedance amplifier. As shown in FIG. 14, the optoelectronic device is mounted within a recessed cavity 140 formed in the same structure that includes the feed-through metallization 127. Other circuitry as well as passive components may be mounted in the recessed cavity and encapsulated within the package. The feed-through metallization 127 extends through one or more micro-vias (i.e., through-holes) in the lower section of the base 125. The feed-through metallization 27 extends along the outer surface of the base 125 and is electrically connected to solder bumps 132 for printed board assembly. The feed-through metallization 127 also extends outside the recessed cavity 140 along the cavity-side surface of the base structure 125. Wire bonds 128 may provide the electrical connections from the feed-through metallization 127 to the optoelectronic device 124 and the integrated circuit chip 126.

A solder seal ring 130 may be provided on the cavity-side surface of the base structure 125 for hermetically attaching the lid 122 to the base 125.

The various techniques discussed above in connection with FIGS. 2 through 11 may be used to form the through-hole structure 125. For example, if the through-hole structure includes silicon or other semiconductor substrates, dry etching or wet etching techniques may be used to form the through-holes. In one particular implementation, where an edge emitting optoelectronic device is to be mounted in the recessed cavity 140 of the base 125, an anisotropic wet etching technique may result in slanted sidewalls (see, e.g., FIG. 6) to provide a reflective surface that re-directs light from the device through the lid 122 and out of the assembly 120.

Figure 15A:
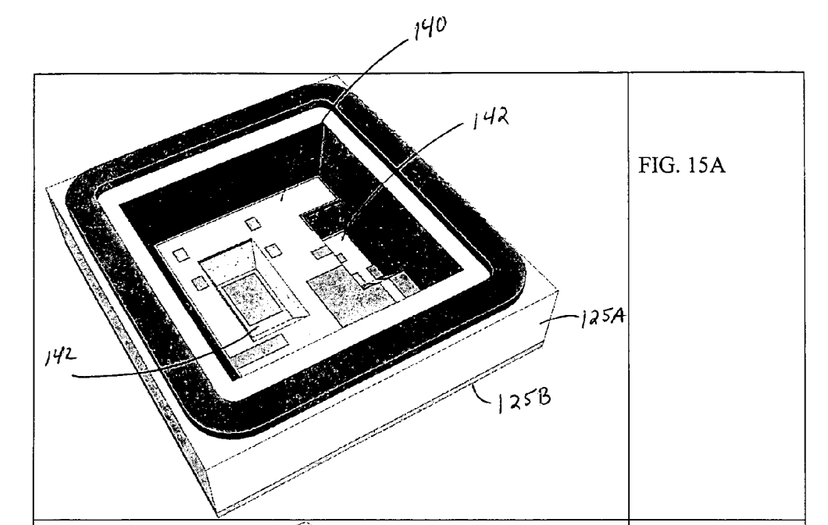
FIGS. 15A and 15B illustrate an example of a base for the assembly according to another implementation.
Figure 15B:
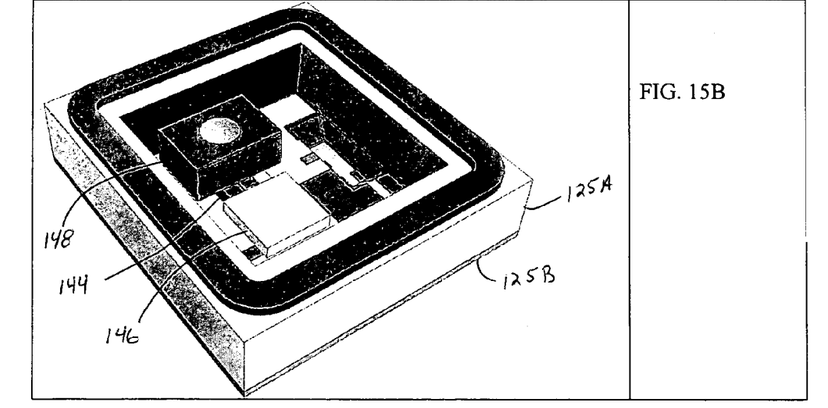

In some implementations, the sub-structure 125A (see FIG. 14) may be formed from etched silicon, or etched or molded glass. Such techniques may facilitate the formation of additional, smaller recesses 142 in the larger recess 140, as shown, for example, in FIG. 15A. The smaller recesses may define areas for mounting various micro components such as a laser 144, a monitor diode 146, and an optical lens 148 (see FIG. 15B), while allowing the use of a flat lid to cover the components as in FIG. 14. Etching techniques may require the use of multiple photolithographic steps to define the separate smaller recesses 142.

The foregoing techniques and structures may be used in connection with assemblies for a wide range of micro components, including, but not limited to, electronic devices, optical devices, electromagnetic devices, chemical devices, micro-mechanical devices, optoelectronic devices, MEMS devices, MOEMS devices and other such devices that contain tiny, micron and sub-micron-sized elements.

Other implementations are within the scope of the following claims.

What is claimed is:

1. A method of forming an assembly to house one or more micro components, the method comprising:

providing a first sub-structure having a first through-hole; and attaching the first sub-structure to a second sub-structure having a group of one or more through-holes each of which is smaller than the first through-hole in the first sub-structure, wherein the group of smaller through-holes in the second sub-structure is positioned opposite the through-hole in the first sub-structure.

2. The method of claim 1 including providing feed-through metallization in at least one of the through-holes in the second sub-structure.

3. The method of claim 1 wherein the second sub-structure is at least several times thinner than the first sub-structure.

4. The method of claim 1 including using the structure comprising the first and second sub-structures as a lid of a housing that encapsulates the one or more micro components.

5. The method of claim 1 including using the structure comprising the first and second sub-structures as a base of a housing that encapsulates the one or more micro components.

6. The method of claim 1 including etching the first sub-structure to form the first through-hole therein.

7. The method of claim 6 wherein the etching includes a dry etching process.

8. The method of claim 6 wherein the etching includes an isotropic wet etching process.

9. The method of claim 6 wherein the etching includes an anisotropic wet etching process.

10. The method of claim 1 including molding the first sub-structure to form the first through-hole therein.

11. The method of claim 1 wherein the through-hole in the first sub-structure has concave sidewalls.

12. The method of claim 1 wherein the through-hole in the first sub- structure has slanted sidewalls.

13. A method of forming an assembly to house one or more micro components, the method comprising:
providing a first sub-structure having a first through-hole and
attaching the first sub-structure to a second sub-structure having a group of one or more through-holes each of which is smaller than the first through-hole in the first sub-structure, wherein the group of smaller through-holes in the second sub-structure is positioned opposite the through-hole in the first sub-structure when the first sub-structure is attached to the second sub-structure.
wherein forming the through-holes in the second sub-structure includes:
partially etching the second sub-structure to form grooves in a surface on a first side of the second sub-structure; and
thinning the second sub-structure from a side opposite the first side.

14. The method of claim 13 wherein thinning the second sub-structure includes using a chemical-mechanical polishing process.

15. The method of claim 13 including:
attaching the second sub-structure to a carrier substrate before performing the thinning of the second sub-structure; and
removing the carrier substrate from the second sub-structure after the first sub-structure is attached to the second sub-structure.

16. The method of claim 13 including attaching the first sub-structure to the second sub-structure after partially etching the second sub-structure to form the grooves, but before performing the thinning.

17. The method of claim 16 including providing feed-through metallization in at least one of the grooves in the second sub-structure before thinning the second sub-structure, wherein the thinning exposes the feed-through metallization.

18. A method of forming an assembly to house one or more micro components, the method comprising:
providing a first sub-structure having a first through-hole; and
attaching the first sub-structure to a second sub-structure having a group of one or more through-holes each of which is smaller than the first through-hole in the first sub-structure and each of which has a diameter less than ten microns, wherein the group of smaller through-holes in the second sub-structure is positioned opposite the through-hole in the first sub-structure.

19. A method of forming an assembly to house one or more micro components, the method comprising:
providing a first substantially planar sub-structure having a first through-hole;
attaching the first sub-structure to a second substantially planar sub-structure; and
subsequently forming a group of one or more through-holes in the second sub-structure, wherein each through-hole in the second sub-structure is smaller than the first through-hole in the first sub-structure, wherein the group of smaller through-holes in the second sub-structure is positioned opposite the through-hole in the first sub-structure.

20. The method of claim 19 including providing feed-through metallization in at least one of the through-holes in the second sub-structure.

21. The method of claim 19 wherein the second sub-structure is at least several times thinner than the first sub-structure.

22. The method of claim 19 including using the structure comprising the first and second sub-structures as a lid of a housing that encapsulates the one or more micro components.

23. The method of claim 19 including using the structure comprising the first and second sub-structures as a base of a housing that encapsulates the one or more micro components.

24. The method of claim 19 including etching the first sub-structure to form the first through-hole therein.

25. The method of claim 24 wherein the etching includes a dry etching process.

26. The method of claim 24 wherein the etching includes an isotropic wet etching process.

27. The method of claim 24 wherein the etching includes an anisotropic wet etching process.

28. The method of claim 19 wherein the through-hole in the first sub-structure has concave sidewalls.

29. The method of claim 19 wherein the through-hole in the first sub-structure has slanted sidewalls.

* * * * *

UNITED STATES PATENT AND TRADEMARK OFFICE
CERTIFICATE OF CORRECTION

PATENT NO. : 7,681,306 B2
APPLICATION NO. : 10/833428
DATED : March 23, 2010
INVENTOR(S) : Matthias Heschel and Arnd Kilian It is certified that error appears in the above-identified patent and that said Letters Patent is hereby corrected as shown below:

Claim 12, column 7, line 17, delete "sub- structure" and insert --sub-structure--;

Claim 13, column 7, line 20, delete "through-hole" and insert --through-hole;--;

Claim 13, column 7, line 29, delete "sub-structure." and insert --sub-structure,--.

Signed and Sealed this

Thirteenth Day of July, 2010

David J. Kappos
*Director of the United States Patent and Trademark Office*